(12) United States Patent
Lunt et al.

(10) Patent No.: US 9,331,298 B2
(45) Date of Patent: May 3, 2016

(54) NANOCLUSTER BASED LIGHT EMITTING DEVICE

(71) Applicant: Board of Trustees of Michigan State University, East Lansing, MI (US)

(72) Inventors: Richard R. Lunt, Williamston, MI (US); Padmanaban Sasthan Kuttipillai, Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 0 days.

(21) Appl. No.: 14/483,641

(22) Filed: Sep. 11, 2014

(65) Prior Publication Data

US 2015/0069366 A1 Mar. 12, 2015

Related U.S. Application Data

(60) Provisional application No. 61/877,124, filed on Sep. 12, 2013.

(51) Int. Cl.
*H01L 29/08* (2006.01)
*H01L 51/50* (2006.01)
*H01L 51/52* (2006.01)
*H01L 51/00* (2006.01)

(52) U.S. Cl.
CPC .......... *H01L 51/502* (2013.01); *H01L 51/5016* (2013.01); *H01L 51/0036* (2013.01); *H01L 51/0037* (2013.01); *H01L 51/0047* (2013.01); *H01L 51/0083* (2013.01); *H01L 51/0085* (2013.01); *H01L 51/508* (2013.01); *H01L 51/5088* (2013.01); *H01L 51/5206* (2013.01); *H01L 51/5234* (2013.01); *H01L 2251/306* (2013.01); *H01L 2251/308* (2013.01); *H01L 2251/558* (2013.01)

(58) Field of Classification Search
CPC .............. H01L 51/5016; H01L 51/502; H01L 51/0036; H01L 51/0083; H01L 51/0085; H01L 51/5088; H01L 51/0037; H01L 51/5206; H01L 51/5234; H01L 51/0047; H01L 2251/306; H01L 2251/308; H01L 2251/558; H01L 51/508
See application file for complete search history.

(56) References Cited

U.S. PATENT DOCUMENTS

| 6,665,329 | B1 * | 12/2003 | Crawford | H01L 33/502 257/103 |
|---|---|---|---|---|
| 8,470,618 | B2 | 6/2013 | Massies et al. | |
| 2006/0140240 | A1 * | 6/2006 | Chen | A61K 49/0067 372/69 |

OTHER PUBLICATIONS

Cheng et al., "High Efficiency Silcon Nanocrystal Light-Emitting Devices" Nano Letters, vol. 11, pp. 1952-1956 (2011).
M.A. Baldo, "Highly Efficient Phosphorescent Emission from Organic Electroluminescent Devices," Letters to Nature, Macmillan Publishers Ltd., vol. 395, pp. 151-154 (1998).

(Continued)

*Primary Examiner* — Elias M Ullah
(74) *Attorney, Agent, or Firm* — Harness, Dickey & Pierce, P.L.C.

(57) ABSTRACT

A luminescent device including an emission layer having luminescent nanoclusters is provided. The luminescent nanoclusters can be phosphorescent metal halides. The luminescent device can emit IR, NIR, colored, or white light and be pumped electrically or optically. A method for manufacturing a luminescent device including an emission layer having luminescent nanoclusters is also provided.

38 Claims, 7 Drawing Sheets

(56) References Cited

OTHER PUBLICATIONS

Carsten Broek et al., "Highly Efficient Near-Infrared Electrophosphorescence from a Pt-Metalloporphyrin Complex," Angewandte Chemi, vol. 119, pp. 1127-1130 (2007).

Andrey L. Rogach et al., "Infrared-Emitting Colloidal Nanocrystals: Synthesis, Assembly, Spectroscopy, and Applications." www.Small-Journal.com, vol. 3, No. 4, pp. 536-557 (2007).

Edward H. Sargent, "Infrared Quantum Dots," Advanced Materials, vol. 17, No. 5, pp. 515-522 (2005).

G. Schmid et al., "Metal Clusters and Nanoparticles," Philosophical Transactions of The Royal Society A, vol. 368, pp. 1207-1210 (2010).

Benjamin S. Harrison et al., "Near-Infrared Electroluminescence from Conjugated Polymer/Lanthanide Porphyrin Blends," Applied Physics Letters, vol. 79, pp. 3770-3772 (2001).

C. W. Tang et al., "Organic electroluminescent diodes," Applied Physics Letters, vol. 51, pp. 913-915 (1987).

Junji Kido et al. "Organo Lanthanide Metal Complexes for Electroluminescent Materials," Chemical Reviews, vol. 102, No. 6, pp. 2357-2368 (2002).

M. J. Anc et al., "Progress in Non-Cd Quantum Dot Development for Lighting Applications," ESC Journal of Solid State Science and Technology, vol. 2, pp. R3071-3082 (2013).

Sivaramapanicker Sreejith et al., "Squaraine dyes: a mine of molecular materials," Journal of Materials Chemistry, vol. 18, pp. 264-274 (2008).

Richard R. Lunt et al., "Transparent Luminescent Solar Concentrators for Large-Area Solar Windows Enabled by Massive Stokes-Shift Nanocluster Phosphors," Advanced Energy Materials, pp. 1-6 (2013).

Sebastian Reineke et al., "White organic light-emitting diodes: Status and perspective," Reviews of Modern Physics, vol. 85, pp. 1245-1293 (2013).

John P. Zimmer et al., "Size Series of Small Indium Arsenide-Zinc Selenide Core-Shell Nanocrystals and Their Application to In Vivo Imaging," Journal of American Chemical Society, vol. 128, pp. 2526-2527 (2006).

\* cited by examiner

NANOCLUSTER BASED LIGHT EMITTING DEVICE

CROSS-REFERENCE TO RELATED APPLICATIONS

This application claims the benefit of U.S. Provisional Application No. 61/877,124, filed on Sep. 12, 2013. The entire disclosure of the above application is incorporated herein by reference.

BACKGROUND

An important route to the reduction of green gasses lies in energy utilization. In particular, lighting accounts for about 17% of the total energy consumption in buildings. State of the art white organic light emitting devices (WOLEDs) are currently poised to make reductions in this consumption rate for lighting as power efficiencies greater than that of fluorescent lighting have been demonstrated. However, WOLEDs are currently limited by high external quantum efficiencies at low overall brightness and are reliant on precious metal, Pt and Ir, containing phosphorescent dopants. To circumvent these shortcomings, next-generation devices based on nanostructured inorganic phosphorescent dopants and abundant molecular phosphorescent materials are needed.

Near-infrared (IR) luminescent devices are widely employed in various industrial, scientific, laser, telecommunications and medical applications. In recent years there has been a growing interest in infrared organic light emitting devices (OLEDs). The most notable application of these IR-OLEDs is in medical deep tissue imaging, where the transmittance of IR light through body fluid enables the diagnosis of critical life-threatening conditions. Another important application is in telecommunication systems, as IR-OLEDs have low loss optical signal propagation. However, the design of high quantum yield small-band gap emitter molecules has remained elusive. Nonetheless, materials that have been used as IR emitters in OLEDs include rare earth lanthanide ions (Yb, Nd, Er, etc.), organic dyes, transition-metal complexes, low band gap polymers and colloidal quantum dot nanocrystals. However, lanthanides are non-earth abundant; dye-based OLEDs have low efficiency (<0.5%) in the near-infrared and infrared and have issues with device stability; transition-metal-based OLEDs use costly Pt and Ir; and polymer-based OLEDs suffer from low external quantum efficiencies (EQEs) ranging from 0.03-0.05%. Quantum dot IR-OLEDs are solution processible, possess unique size dependent optical properties owing to the quantum confinement effect, and have tunable emissions and device external quantum efficiencies of 2-10%. However, quantum dots contain toxic compounds, such as PbX (where X=S, Se or Te), InAs and HgTe, as well as PbX—CdS and InAs—ZnSe. The European Union and developing countries strictly restrict the use of heavy metals (e.g. Cd, Hg, Pb) in commercial lightning beyond the 100 ppm level. To circumvent these restrictions and growing environmental and health concerns, various non-cadmium based quantum dots have recently attracted the interest of the research community. OLEDs with these materials have comparable performance metrics to their Cd-based counterparts, showing electro luminescence (EL) up to 800 nm. These quantum dots have been made using Si, III-V group elements (e.g. InP), I-III-VI$_2$ group (e.g. CuInS$_2$) and Mn$^{2+}$ doped ZnS and ZnSe nanocrystals. Moreover, nanocrystals specifically are smaller crystals of the bulk and therefore exhibit crystallographic planes and expose dangling bonds. The nature of the nanocrystal surfaces therefore makes them highly susceptible to degradation through interactions with moisture and oxygen similarly to degradation pathways seen with organic molecules.

Visibly emitting OLEDs have gained tremendous attention since the first demonstration of the 1% efficient bilayer OLED by Tang in 1987. Steady progress in OLED performance has led to the recent commercialization of OLEDs for both lighting and display applications. OLEDs exhibit several advantageous features as compared to traditional lighting and display technologies: 1) each pixel can be color-tuned, and hence can actively generate the desired color instead of relying on white light filtering leading to, 2) nearly infinite contrast ratios, 3) displays with reduced viewing angle dependence, 4) power efficiencies surpassing that of fluorescent lighting, 5) highly color tunable for 'warm-hue' lighting, and 6) displays and lighting panels thinner than 1 mm. Advances have also led to phosphorescent OLED lifetimes approaching $10^6$ hours for red and >$10^5$ hours for green OLEDs, though lifetime still remains a challenge for phosphorescent organic dopants. The external quantum efficiency of emitted light in the forward viewing direction of an OLED, which relates the number of photons emitted to the number of injected electrons, is:

$$\eta_{EQE} = \gamma_R \eta_S \eta_{OC} \Phi = \eta_{ICE} \eta_{OC} = \frac{q}{Ihc} \int \lambda P_S d\lambda$$

where $\gamma_R$ is the recombination probability, $\eta_S$ is the spin formation efficiency, $\Phi$ is the luminescence efficiency for the spins produced, $\eta_{OC}$ is the out coupling efficiency, $\eta_{IQE}$ is the internal quantum efficiency for converting charge into photons, $P_S(\lambda)$ is the measured output spectral power, q is the electronic charge, h is planks constant, c is the speed of light, and I is the electrical current. For fluorescent and phosphorescent devices $\eta_S$=0.25 and $\eta_S$=1 respectively. Thus, the ability to harvest triplet excitons through efficient phosphorescent emission greatly enhances the overall efficiency potential. For example, phosphorescent devices with $\eta_{IQE}$=100% have routinely been demonstrated for Ir and Pt containing dopants. However, the ability to produce these devices at low cost over a large area without Ir and Pt is still a challenge that must be overcome for the ubiquitous emergence of OLEDs in lighting and other near-infrared applications.

SUMMARY

This section provides a general summary of the disclosure, and is not a comprehensive disclosure of its full scope or all of its features.

In accordance with the present teachings, a luminescent device, such as an LED, comprising an emission layer comprising luminescent nanoclusters is provided. The luminescent nanoclusters can be hexanuclear clusters, octahedral clusters, Chevral clusters, edge-capped halide clusters, metal clusters, or Chalcogenide clusters. In various embodiments, the hexanuclear clusters comprise a phosphorescent metal halide nanocluster or a phosphorescent metal halide nanocluster salt that can be solvated or hydrated. In order to provide improved color rendering for white light emission, the luminescent device can further comprise at least one dopant. The dopant can be mixed with the luminescent phosphorescent nanoclusters, disposed as a separate layer on top of the emission layer, or be present in a separate LED layer or device that is positioned above or below the luminescent device. The dopant can be a luminescent phosphorescent nanocluster, an organic dopant, or combinations thereof. In other embodiments, the luminescent phosphorescent nanoclusters are embedded in a host material. In yet another embodiment, the emission layer is disposed adjacent to a UV-emitting LED, wherein the UV light activates the emission layer to emit NIR light.

The luminescent device can further comprise an anode and a cathode for applying a current through the emission layer. In this embodiment, the emission layer is disposed between the anode and the cathode. Additionally, the luminescent device can comprise a conductive layer, also referred to as a hole injection layer, that promotes the injection of holes. In various configurations, the conductive layer is positioned adjacent to the emission layer and between the anode and the cathode. In other embodiments, the luminescent device further comprises an electron transport layer for injecting electrons directly into the emission layer. In other embodiments, either an exciton blocking layer or hole blocking layer, or a combination of both, can be positioned on the both sides of luminescent layer to confine the exciton in the emissive layer thus improving the quantum efficiency of the device. A luminescent device comprising an emission layer and an electron transport layer may or may not include a conductive layer.

The present teachings also provide a method for manufacturing a luminescent device. The method comprises obtaining a patterned indium tin oxide (ITO) glass, transferring a conductive layer onto the ITO glass, preparing an emission layer film comprising luminescent phosphorescent nanoclusters, transferring the emission layer film to the conductive layer, and depositing a cathode on top of the emission layer film. In various embodiments, the method further comprises depositing an electron injection layer, an exciton blocking layer and hole blocking layers onto the emission layer film. The luminescent device is configured to emit visibly colored light, white light, IR light, or NIR light.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DETAILED DESCRIPTION

The preferred embodiments of the present device and manufacturing method are directed to a luminescent device comprising an emission layer comprising luminescent nanoclusters. The luminescent device is electrically or optically pumped, and is configured to emit visibly colored, white, infrared (IR), or near-infrared (NIR) light. In various embodiments, the luminescent nanoclusters comprise elements that are abundant on Earth. Therefore, the present devices can be manufactured at low cost and can be devoid of rare elements, such as Ir and Pt, or toxic compounds containing Pb.

As used herein, a "nanocluster" is defined as an inorganic molecular species, exactly defined in chemical composition and structure at the nanometer scale. Nanoclusters contain at least 3 atoms, but typically contain tens to hundreds of atoms. Nanoclusters are distinct from nanocrystals in that nanoclusters do not have repeating structures, but can form the smallest unit from which a larger crystalline or amorphous ensemble could be assembled. In contrast, the terms "nanoparticle" and "nanocrystal" refer to particles of less precise characterization that are linked with a certain size distribution and have therefore been referred to as "colloids" historically. The terms "colloidal nanocrystal" and "colloidal quantum dot" are therefore synonymous with "nanocrystal" and "nanoparticle". Nanocrystals are typically distinguished from nanoparticles by the crystalline and amorphous nature of the nanocrystal or nanoparticle, in that nanoparticles are typically amorphous or crystalline and nanocrystals have some crystalline repeating order. Typically, nanocrystals are assembled from single element units such as Si or simple, compounds such as PbS, InP, GaAs, etc. Schmid et al. ("Metal dusters and nanoparticles," Phil. Trans. R. Soc. A (2010) 368, 1207-1210) provides distinctions between nanoclusters and nanoparticles.

Figure 1:
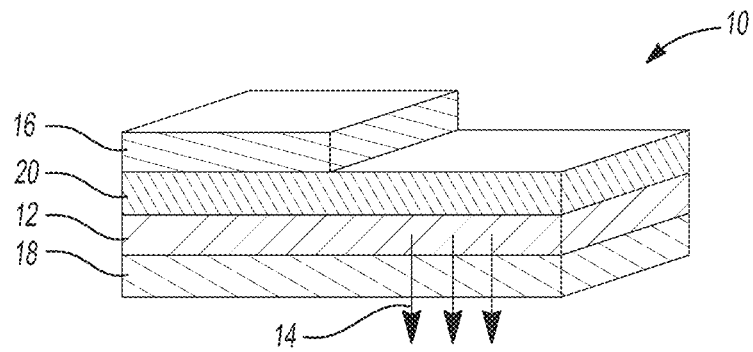
FIG. 1 is a graphic illustration of a first luminescent device.

Referring to FIG. 1, a first embodiment of a luminescent device 10 includes an emission layer 12 comprising luminescent nanoclusters. In various embodiments, the device is electrically pumped. The emission layer 12 can have a thickness of from about 2 nm to about 100 nm. Preferably, the emission layer 12 has a thickness of from about 10 nm to about 20 nm. The luminescent nanoclusters can be hexanuclear clusters, octahedral clusters, Chevral clusters, edge-capped halide clusters, metal clusters or Chalcogenide clusters. The hexanuclear clusters can comprise a metal halide nanocluster or a metal halide nanocluster salt, phosphorescent or otherwise. Accordingly, in some embodiments the emission layer 12 comprises luminescent phosphorescent nanoclusters. In various embodiments, the nanocluster metal halide or metal halide salt is $M_6X_{12}$, $M_6X_{12} \cdot nR$, $A_2M_6X_{14}$, $A_2M_6X_{14} \cdot nR$, $EM_6X_{14}$, $EM_6X_{14} \cdot nR$, $M_6X_8L_6$, $A_2M_6X_8L_6$, $M_6X_{14}$, $M_6X_{14} \cdot nR$, $A_4M_6X_{18}$, or $A_4M_6X_{18} \cdot nR$, wherein M represents metals, X represents halogens, A and E represents terminal 1+ and 2+ cations respectively, R represents a first ligand, L represents a second ligand, and n is a value between zero and M+X. In various embodiments, M is Mo, W, Cr, Mn, Tc, Re, Cu, Ti, V, Ta, Nb, Sn, Zn, Zr, or Ga; X is F, Cl, Br, I, At, or a mixture thereof; and A is $H^+$, $H_3O^+$, $K^+$, $Na^+$, $Li^+$, $Rb^+$, $Cu^+$, $Cs^+$, ammonium, butylammonium, tetrabutylammonium (TBA), or $NR'_4^+$ where R' is independently selected from alkyl or aryl groups, wherein R' is optionally substituted with one or more of halo, nitro, cyano, hydroxy, hydroxyalkyl, haloalkyl, haloalkoxy, amino, azido, carboxy, carbamoyl, mercapto, sulphamoyl, $C_{1-10}$ alkyl, $C_{2-10}$ alkenyl, $C_{2-10}$ alkynyl, $C_{1-10}$ alkoxy, $C_{1-10}$ alkoxyalkyl, $C_{1-10}$ alkanoyl, $C_{1-10}$ alkanoyloxy, N—($C_{1-10}$ alkyl)amino, N,N—($C_{1-10}$ alkyl)$_2$ amino, $C_{1-10}$ alkanoylamino, N—($C_{1-10}$ alkyl)carbamoyl, N,N—($C_{1-10}$ alkyl)$_2$carbamoyl, $C_{1-10}$ alkyl-S(O)$_a$ wherein a is 0, 1 or 2, $C_{1-10}$ alkoxycarbonyl, N—($C_{1-10}$ alkyl)sulphamoyl, N,N—($C_{1-10}$ alkyl)$_2$sulphamoyl, $H_2NS(O)_2NH$—, N—($C_{1-10}$ alkyl)NHS(O)$_2$NH—, N,N—($C_{1-10}$ alkyl)$_2$NS(O)$_2$ NH—, aryl, aryloxy, arylthio, heteroaryl, heteroaryloxy, cycloalkyl, cycloalkyloxy, heterocyclyl, heterocyclyl (C=O)—, heterocyclyloxy and heterocyclylthio, wherein these selections are non-limiting; L is F, Cl, Br, I, At, S or a mixture thereof, E is $Be^{2+}$, $Mg^{2+}$, $Ca^{2+}$, $Sr^{2+}$, $Cu^{2+}$, $Ni^{2+}$, $Ti^{2+}$, $Ba^{2+}$+ or a mixture thereof; and R is $H_2O$, $CH_3CN$, or any other solvate.

Phosphorescent metal halide clusters, for example Metal (II) halide clusters, can be modified from the parent salt compounds through ligand exchange reactions. The parent ion is usually synthesized through reduction of commercially available $M(V)X_5$, or obtained directly in the form of $M(II)X_2$. For Mo-based clusters, the parent compound is purified by conversion to the HCl salt, which is returned to $M(II)X_2$ or $M(II)X_{12}$ via heat-treatment under vacuum. Ligand exchange can be carried out in a Soxhlet extractor or by direct reaction in acidic solutions in the presence of free cations, forming various complexes or salts respectively. The properties of a selected range of metal halide nanoclusters synthesized here (hydrates and salts) exhibit quantum yields of from about 10% to about greater than about 70%. Many amine and thiol based ligands can be substituted around the terminal halides through thiolate and amine coordination. Moreover, amines and ammonium salts can be readily anchored to polymer chain backbones to enhance particle separation and increase quantum yields. In some embodiments, the luminescent nanoclusters comprise the phosphorescent metal halide $K_2Mo_6Cl_{14}$, $TBA_2Mo_6Cl_{14}$, $(H_3O)_2Mo_6Cl_{14}$, or mixtures thereof.

The luminescent nanoclusters in the emission layer 12 can be embedded in a host material. Non-limiting examples of host materials include polymers, poly(N-vinylcarbazole) (PVK), 1,4,5,8-Naphthalene-tetracarboxylic-dianhydride (NTCDA), 4,4'-Bis(N-carbazolyl)-1,1'-biphenyl (CBP), Poly[2-methoxy-5-(3',7'-dimethyloctyloxy)-1,4-phenylenevinylene] (MDMO), Poly(methyl methacrylate) (PMMA), Poly(ethyl methacrylate) (PEMA), Poly(butyl methacrylate-co-methyl methacrylate), [6,6]-phenyl-C61-butyric acid methyl ester, (PCBM), N,N'-Bis(3-methylphenyl)-N,N'-diphenylbenzidine (TPD), poly[2-methoxy-5-(2-ethylhexyloxy)-1,4-phenylenevinylene] (MEH-PPV), poly(p-phenylene vinylene) (PPV), oxides, metal oxides, fullerenes, $C_{60}$, and glasses. In some embodiments, the host material is co-doped with, for example, 2-(4-biphenylyl)-5-(4-tert-butyl-phenyl)-1,3,4-oxadiazole (PBD).

In various embodiments, the luminescent device may comprise at least one dopant to provide improved color rendering for white light or colored light emission. The dopant can comprise luminescent nanoclusters, luminescent phosphorescent nanoclusters, any dopant commonly known in the art, such as organic dopants, or combinations thereof. Non-limiting examples of organic dopants commonly known in the art include Tris[2-phenylpyridinato-$C^2$,N]iridium(III) (Ir(ppy)$_3$) (which generates green light), iridium(III) bis(4',6'-difluorophenyl-pyridinato) tetrakis (1-pyrazolyl) borate (FIr$_6$) (which generates blue light), platinum octaethylporphyrin (PtOEP) (which generates red light), or RD-15 (a UDC molecule that generates red light). The dopant can be in the emission layer 12, in a separate layer adjacent to or disposed on the emission layer 12, or present in a separate LED device that is positioned above or below the luminescent device. Where the dopant is in the emission layer 12, it is mixed with the luminescent phosphorescent nanoclusters.

Figure 2:
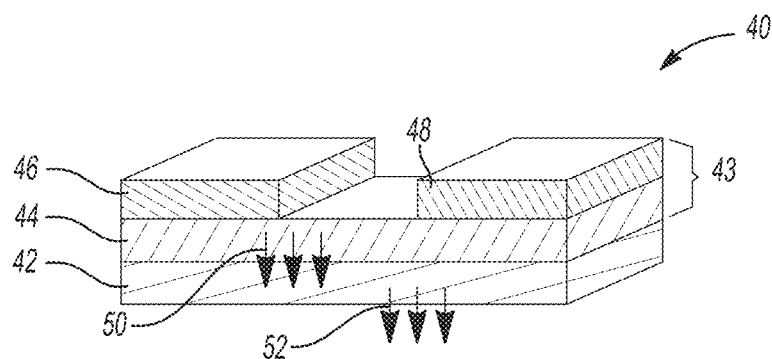
FIG. 2 is a graphic illustration of a second luminescent device.

Alternatively, as shown in FIG. 2, an optically pumped luminescent device 40 can comprise an emission layer 42 comprising luminescent nanoclusters that is disposed adjacent to an LED 43 comprising a UV-emitting material 44, an anode 46, and a cathode 48. In various embodiments, emission layer 42 comprises a host material. In these configurations, the UV-emitting material 44 emits UV light 50, which activates the luminescent nanoclusters in the emission layer 42 to emit red, IR or NIR light 52.

Referring back to FIG. 1, the emission layer 12 emits white light 14 when a voltage is applied between an anode 16 and a cathode 18. In various embodiments, the anode 16 and cathode 18 are independently LiF/Al, Au, Ag, Al, Cu, Cr, In, Li, Mg, W, Zn, Ni, a metal oxide, a transparent conducting oxide, a transparent conducting graphene thin film, a transparent conducting nanotube film, a transparent ultrathin metal, a metal, or metal nanowires. Non-limiting transparent conducting oxides include indium tin oxide (ITO), aluminum doped zinc oxide (AZO), zinc oxide, and gallium zinc oxide (GZO). Non-limiting ultrathin metals include Al, Au, Ag, Mo, or Ni. Non-limiting metals include Al, Au, Ag, Ni, Cu, and Mo. Metal nanowires are Al, Au, or Ag. In various embodiments, the cathode 18 has a thickness of from about 5 nm to about 120 nm. Preferably, the cathode 18 has a thickness of from about 40 nm to about 100 nm.

Additionally, the device 10 can also include an optional conductive layer 20. The conductive layer 20, also referred to as a hole injection layer, functions to promote the injection of holes. When present, the conductive layer 20 is disposed adjacent to the emission layer 12, and the conductive and emission layers 20, 12 are both disposed between the anode 16 and the cathode 18. When the conductive layer 20 is not present, the anode 16 and the cathode 18 can be in direct contact with the emission layer 12. In some embodiments, the conductive layer 20 comprises poly(3,4-ethylenedioxythiophene):poly-(styrene sulfonate) (PEDOT/PSS). In various embodiments, the conductive layer 20 has a thickness of from about 1 nm to about 100 nm. Preferably, the conductive layer 20 has a thickness of about 40 nm.

Device 10 can have a quantum efficiency of at least about 0.001%, at least about 0.1%, at least about 1.0%, at least about 5%, at least about 10%, at least about 15%, at least about 20%, at least about 30% at least about 40%, or at least about 50%.

Figure 3:
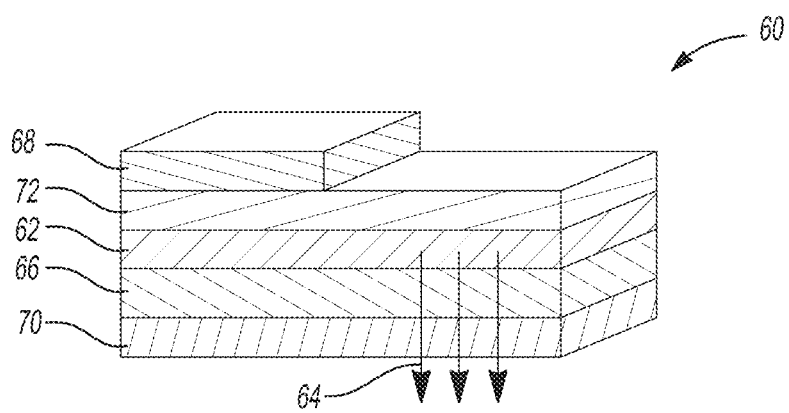
FIG. 3 is a graphic illustration of a third luminescent device.

With reference to FIG. 3, another embodiment of a luminescent device 60 includes an emission layer 62 comprising luminescent nanoclusters, and an electron transport layer 66 disposed adjacent to the emission layer 62. The device 60 emits visibly colored, white, IR, or NIR light. In various embodiments, the device is electrically pumped. The emission layer 62 can have a thickness of from about 2 nm to about 100 nm. In some embodiments, the emission layer 62 has a thickness of from about 10 nm to about 20 nm. The luminescent nanoclusters can be hexanuclear clusters, octahedral clusters, Chevral clusters, edge-capped halide clusters, metal clusters, or Chalcogenide clusters. The hexanuclear clusters can comprise a phosphorescent metal halide nanocluster or a phosphorescent metal halide nanocluster salt. Accordingly, in some embodiments the emission layer 62 comprises luminescent phosphorescent nanoclusters. In various embodiments, the metal halide or metal halide salt is $M_6X_{12}$, $M_6X_{12}$·nR, $A_2M_6X_{14}$, $A_2M_6X_{14}$·nR, $EM_6X_{14}$, $EM_6X_{14}$·nR, $M_6X_8L_6$, $A_2M_6X_8L_6$, $M_6X_{14}$, $M_6X_{14}$·nR, $A_4M_6X_{18}$, or $A_4M_6X_{18}$·nR, wherein M represents metals, X represents halogens, A and E represents terminal 1+ and 2+ cations respectively, R represents a first ligand, L represents a second ligand, and n is value between zero and M+X. In various embodiments, M is Mo, W, Cr, Mn, Tc, Re, Cu, Ti, V, Ta, Nb, Sn, Zn, Zr, or Ga; X is F, Cl, Br, I, At, or a mixture thereof; and A is $H^+$, $H_3O^+$, $K^+$, $Na^+$, $Li^+$, $Rb^+$, $Cu^+$, $Cs^+$, ammonium, butylammonium, tetrabutylammonium (TBA), or $NR'_4{}^+$ where R' is independently selected from alkyl or aryl groups, wherein R' is optionally substituted with one or more of halo, nitro, cyano, hydroxy, hydroxyalkyl, haloalkyl, haloalkoxy, amino, azido, carboxy, carbamoyl, mercapto, sulphamoyl, $C_{1-10}$ alkyl, $C_{2-10}$ alkenyl, $C_{2-10}$ alkynyl, $C_{1-10}$ alkoxy, $C_{1-10}$ alkoxyalkyl, $C_{1-10}$ alkanoyl, $C_{1-10}$ alkanoyloxy, N—($C_{1-10}$ alkyl)amino, N,N—($C_{1-10}$ alkyl)$_2$amino, $C_{1-10}$ alkanoylamino, N—($C_{1-10}$ alkyl)carbamoyl, N,N—($C_{1-10}$ alkyl)$_2$carbamoyl, $C_{1-10}$ alkyl-S(O)$_a$ wherein a is 0, 1 or 2, $C_{1-10}$ alkoxycarbonyl, N—($C_{1-10}$ alkyl)sulphamoyl, N,N—($C_{1-10}$ alkyl)$_2$sulphamoyl, $H_2NS(O)_2NH$—, N—($C_{1-10}$ alkyl)NHS(O)$_2$NH—, N,N—($C_{1-10}$ alkyl)$_2$NS(O)$_2$NH—, aryl, aryloxy, arylthio, heteroaryl, heteroaryloxy, cycloalkyl, cycloalkyloxy, heterocyclyl, heterocyclyl(C=O)—, heterocyclyloxy and heterocyclylthio, wherein these selections are non-limiting; L is F, Cl, Br, I, At, S or a mixture thereof, E is $Be^{2+}$, $Mg^{2+}$, $Ca^{2+}$, $Sr^{2+}$, $Cu^{2+}$, $Ni^{2+}$, $Ti^{2+}$, $Ba^{2+}$ or a mixture thereof; and R is $H_2O$, $CH_3CN$, or any other solvate.

Metal halide clusters, for example phosphorescent metal (II) halide clusters, can be modified from the parent salt compounds through ligand exchange reactions. The parent ion is usually synthesized through reduction of $M(V)X_5$, or obtained directly in the form of $M(II)X_2$. For Mo-based clusters, the parent compound is purified by conversion to the HCl salt, which is returned to $M(II)X_2$ or $M(II)X_{12}$ via heat-treatment under vacuum. Ligand exchange can be carried out in a Soxhlet extractor or by direct reaction in acidic solutions in the presence of free cations, forming various complexes or salts respectively. The properties of a selected range of metal halide complexes synthesized here (hydrates and salts) exhibit quantum yields from about 1% to great than about 70%. Many amine and thiol based ligands can be substituted around the terminal halides through thiolate and amine coordination. Moreover, amines and ammonium salts can be readily anchored to polymer chain backbones to enhance particle separation and increase quantum yields. In a preferred embodiment, the luminescent phosphorescent nanoclusters comprise the metal halide $K_2Mo_6Cl_{14}$, $TBA_2Mo_6Cl_{14}$, $(H_3O)_2Mo_6Cl_{14}$, or a combination thereof.

The luminescent nanoclusters in the emission layer 62 can be embedded in a host material. Non-limiting examples of host materials include poly(N-vinylcarbazole) (PVK), 1,4,5, 8-Naphthalene-tetracarboxylic-dianhydride (NTCDA), 4,4'-Bis(N-carbazolyl)-1,1'-biphenyl (CBP), Poly[2-methoxy-5-(3',7'-dimethyloctyloxy)-1,4-phenylenevinylene] (MDMO), Poly(methyl methacrylate) (PMMA), Poly(ethyl methacrylate) (PEMA), Poly(butyl methacrylate-co-methyl methacrylate), [6,6]-phenyl-C61-butyric acid methyl ester, (PCBM)N, N'-Bis(3-methylphenyl)-N,N'-diphenylbenzidine (TPD), poly[2-methoxy-5-(2-ethylhexyloxy)-1,4-phenylenevinylene] (MEH-PPV), poly(p-phenylene vinylene) (PPV), and glasses. In some embodiments, the host material is co-coped with 2-(4-biphenylyl)-5-(4-tert-butyl-phenyl)-1,3,4-oxadiazole (PBD).

The electron transport layer 66 transports electrons directly to the luminescent nanoclusters in the emission layer 62. The electron transport layer 66 can be composed of any electron transport material commonly known in the art. Non-limiting examples of electron transport materials include $C_{60}$, tris(8-hydroxyquinolinato)aluminium, bathocuproine (BCP), bathophenanthroline (BPhen), bis-(2-methyl-8-chinolinolato)-(4-phenylphenolato)-aluminium(III), (BAlq2), Phenyl-C61-butyric acid methyl ester (PCBM), $C_{60}$, a fullerene, a metal oxide, $MoO_3$, and combinations thereof. In various embodiments, the electron transport layer 66 further comprises a buffer layer. A preferred buffer layer includes $MoO_3$. In other embodiments, the electron transport layer 66 consists of $MoO_3$. Preferably, the electron transport 66 layer has a thickness of from about 2 nm to about 75 nm. More preferably, the electron transport layer 66 has a thickness of about 30 nm.

The emission layer 62 emits colored, white, IR, or NIR light 64 when a voltage is applied between an anode 68 and a cathode 70. In various embodiments, the anode 68 and cathode 70 are independently LiF/Al, Au, Ag, Al, Cu, Cr, In, Li, Mg, W, Zn, Ni, a metal oxide, a transparent conducting oxide, a transparent conducting graphene thin film, a transparent conducting nanotube film, a transparent ultrathin metal, a metal, or metal nanowires. Non-limiting transparent conducting oxides include indium tin oxide (ITO), aluminum doped zinc oxide (AZO), zinc oxide, and gallium zinc oxide (GZO). Non-limiting ultrathin metals include Al, Au, Ag, Mo, or Ni. Non-limiting metals include Al, Au, Ag, Ni, Cu, and Mo. Non-limiting metal nanowires are Al, Au, or Ag. In various embodiments, the cathode 70 has a thickness of from about 5 nm to about 120 nm. Preferably, the cathode 70 has a thickness of from about 40 nm to about 100 nm.

Additionally, the device 60 can also include an optional conductive layer 72. The conductive layer 72, also referred to as a hole injection layer, functions to promote the injection of holes. When present, the conductive layer 72 is disposed adjacent to the emission layer 62, and the conductive and emission layers 72, 62 are both disposed between the anode 68 and the cathode 70. When the conductive layer 72 is not present, the anode 68 and the cathode 70 can be in direct contact with the emission layer 62 and the electron transport layer 66, respectively. In a preferred embodiment, the conductive layer 72 comprises poly(3,4-ethylenedioxythiophene):poly-(styrene sulfonate) (PEDOT/PSS). In preferred embodiments, the conductive layer 72 has a thickness of from about 2 nm to about 100 nm. Preferably, the conductive layer 72 has a thickness of about 40 nm.

Device 60 can have a quantum efficiency of at least about 0.001%, at least about 0.1%, at least about 1.0%, at least about 5%, at least about 10%, at least about 15%, at least about 20%, at least about 30% at least about 40%, or at least about 50%.

Figure 4:
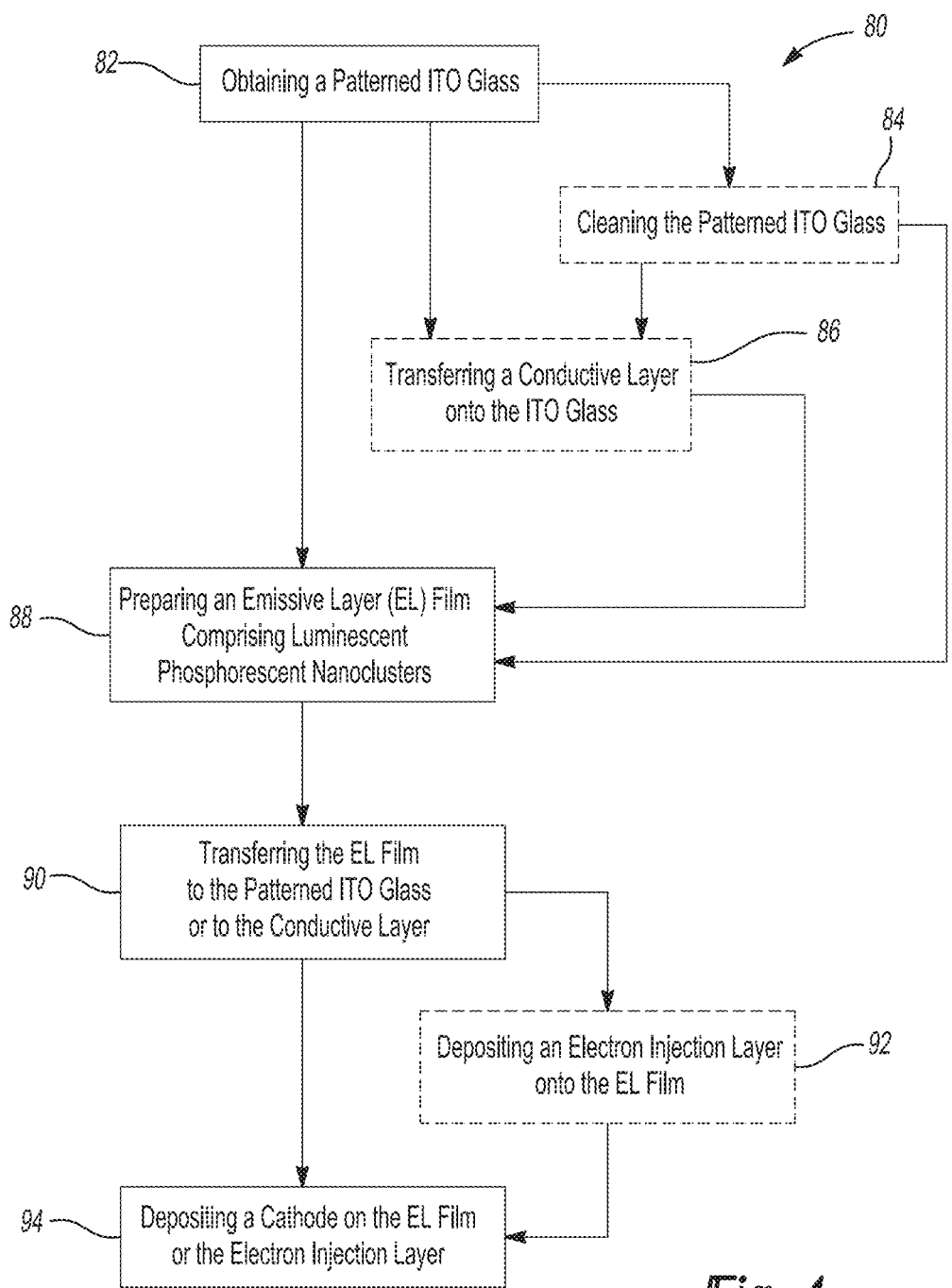
FIG. 4 is a flow chart illustrating a method of manufacturing a luminescent device.

As shown in FIG. 4, the present technology also provides a method 80 of manufacturing luminescent devices comprising an emission layer comprising luminescent nanoclusters. The dashed boxes in FIG. 4 represent optional steps. The method 80 comprises obtaining a patterned ITO glass 82, optionally transferring a conductive layer onto the ITO glass 86, preparing an emission layer (EL) film comprising luminescent nanoclusters 88, transferring the EL film to the ITO glass or to the conductive layer when present 90, and depositing a cathode 94. Following the method 80 up to this point will allow for the manufacture of a device as described in FIG. 1 that emits white light. To obtain a device as described in FIG. 3 that emits IR, NIR, red light, or light of another color, the method 80 further comprises depositing an electron injection layer onto the EL film 92.

In various embodiments, the method 80 further comprises cleaning the patterned ITO glass 84 by degreasing the ITO glass in a solvent and treating the ITO glass with UV-ozone. After the optional cleaning step 84, either transferring the conductive layer onto the ITO glass 86 or preparing the emissive layer film 88 can be performed.

Transferring the conductive layer onto the ITO 86 comprises spin casting, spin coating, dip coating, doctor blading, or spray coating the conductive layer onto the patterned ITO glass. Transferring the conductive layer 86 may further comprise annealing the conductive layer by incubating at an annealing temperature. The annealing temperature is from about 200° C. to about 300° C. Incubating can be performed for from about 10 minutes to about 60 minutes. In a preferred embodiment, the conductive layer is annealed by incubating at about 250° C. for about 30 minutes. Preferably, transferring the conductive layer results in a conductive layer thickness of from about 2 nm to about 100 nm. More preferably, the conductive layer thickness is about 40 nm. A preferred conductive layer comprises PEDOT/PSS.

In various embodiments, preparing the EL film 88 comprises preparing a host solution and a luminescent nanocluster solution or a luminescent phosphorescent nanocluster solution, and combining the two solutions. The host solution can comprise, as non-limiting examples, PVK, NTCDA, CBP, MDMO, PMMA, PEMA, MEH-PPV, or TPD. For example, in various embodiments preparing a host solution comprises preparing a 5 mg/ml PVK solution in chloroform. Preparing the luminescent nanoclusters solution comprises preparing a 4 mg/ml nanoclusters solution in a toluene and methanol mixture. The toluene and methanol mixture can comprise a toluene:methanol ratio of about 1:3, about 2:3, about 1:1, about 4:3, about 5:3, or about 2:1. In a preferred embodiment, the toluene:methanol ratio is about 4:3. One of the 5 mg/ml PVK solution is then combined with the nanoclusters solution to generate a PVK-nanocluster EL film. The host solution and the nanoclusters solution are combined at host solution:nanocluster solution ratio of about 1:3, about 2:3, about 1:1, about 4:3, about 5:3, or about 2:1. In a preferred embodiment, the host solution:nanocluster solution ratio is about 2:1. In other embodiments, the luminescent nanocluster solution or luminescent phosphorescent nanocluster solution is spin coated onto the ITO glass or conductive layer without a host. Transferring the EL film 90 to the ITO glass or to the conductive layer when present comprises spin casting, spin coating, dip coating, doctor blading, or spray coating the EL film onto either the ITO glass or the conductive layer. Spin casting comprises rotating the ITO glass, with or without the conductive layer, at from about 500 rpm to about 5000 rpm for from about 10 seconds to about 120 seconds. After rotating, spin casting further comprises baking at from about 75° C. to about 300° C. for from about 5 minutes to about 60 minutes. In a preferred embodiment, spin casting comprises rotating at about 2000 rpm for about 30 seconds and baking at about 100° C. for about 30 minutes under nitrogen atmosphere. Spin casting results in an EL film with a thickness of about 2 nm to about 100 nm.

When manufacturing a device as shown in FIG. 3, depositing the electron injection layer onto the EL film 92 comprises evaporating an electron injection material on the EL film at a pressure of from about $1 \times 10^{-10}$ to about $1 \times 10^{-3}$ Torr or by spin coating an electron injection material on the EL film. In a preferred embodiment, the pressure is about $3 \times 10^{-6}$ Torr. The electron injection material can be $C_{60}$, tris(8-hydroxyquinolinato)aluminum, bathocuproine (BCP), bathophenanthroline (BPhen), bis-(2-methyl-8-chinolinolato)-(4-phenylphenolato)-aluminium(III) (BAlq2), or Phenyl-C61-butyric acid methyl ester (PCBM). In some embodiments, the electron injection layer includes a buffer material, such as $MoO_3$. A preferred electron injection layer comprises a fullerene and BCP and has a thickness of from about 2 nm to about 75 nm. In other embodiments, the electron transport layer consists of $MoO_3$.

Depositing the cathode 94 comprises thermally evaporating a cathode material. The cathode material can be any cathode material described herein, such as LiF/Al, Au, Ag, Al, Cu, Cr, In, Li, Mg, W, Zn, Ni, a metal oxide, a transparent conducting oxide, a transparent conducting graphene thin film, a transparent conducting nanotube film, a transparent ultrathin metal, a metal, or metal nanowires. The transparent conducting oxide can be indium tin oxide (ITO), aluminum doped zinc oxide (AZO), zinc oxide, or gallium zinc oxide (GZO); the transparent ultrathin metal can be Al, Au, Ag, Mo, or Ni; the metal can be Al, Au, Ag, Ni, Cu, or Mo; and the metal nanowire can be Al, Au, or Ag. Depending on whether the step of depositing the electron injection layer 92 is performed, the cathode is deposited on either the EL film or on the electron injection layer.

Alternatively, optically pumped luminescent devices comprising luminescent phosphorescent nanoclusters can also be manufactured. Methods for manufacturing optically pumped devices include coating a UV-LED with a solution comprising luminescent nanoclusters. Optionally, the luminescent phosphorescent nanoclusters are embedded in a host material. Coating the UV-LED can be performed by any method commonly known in the art. In a preferred embodiment, the luminescent nanoclusters are dip-coated onto the UV-LED and allowed to dry. Dip-coating and drying can be repeated until a desired number of nanocluster layers are generated on the UV-LED.

Methods and devices among those of the present technology are illustrated in the following non-limiting examples.

Example 1

UV-VIS Absorbance and PL Measurement of Polymer/Nanoclusters Blend Films

A 5 mg/ml PVK solution in chloroform and a 4 mg/ml $TBA_2Mo_6Cl_{14}$ nanocluster solution was prepared in a toluene and methanol mixture. The PVK solution was combined with the nanocluster solution at a 2:1 ratio. The PVK:nanocluster solution is spun cast as a film on cleaned glass slides at 2000 rpm for 30 seconds.

Figure 5:
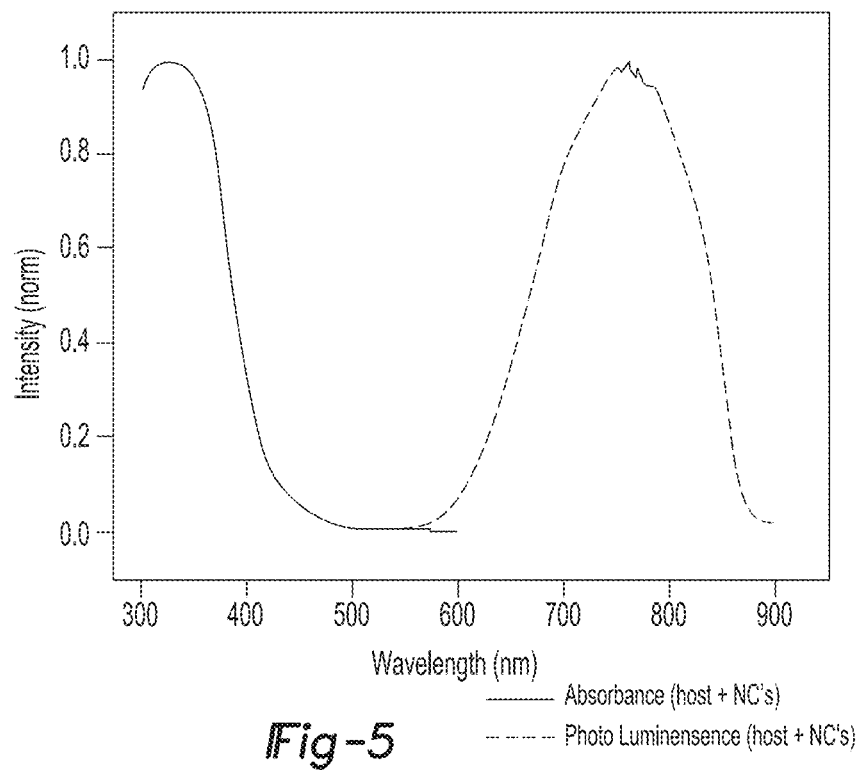
FIG. 5 shows the typical absorbance and photoluminescence spectra of polymer:nanocluster films.

A UV-VIS absorbance spectrum was recorded between 300 nm to 900 nm in a Perkin Elmer UV-VIS Spectrometer. Photoluminescence (PL) spectra were recorded in a Quanta Mater 40 spectra fluorometer. For PL measurement, the films were excited at 350 nm and the PL spectrum was recorded between 450 nm to 900 nm under a nitrogen atmosphere. FIG. 5 shows the absorbance and PL spectra of a nanocluster on a PVK host film. The nanocluster adsorbs at 350 nm and emits between 600 nm to 850 nm.

Manufacturing and Characterizing Device 1

Patterned ITO glass was cleaned by degreasing in various solvents followed by UV-ozone treatment. A 40 nm thick layer of PEDOT/PSS was spun cast at 3000 rpm for 30 seconds onto the ITO glass as a hole injection layer. The PEDOT/PSS was then annealed to the ITO glass by incubating at 250° C. for 30 minutes.

A 15-20 nm thick emission layer (EL) comprising PVK and $TBA_2Mo_6Cl_{14}$ or $(H_3O)_2Mo_6Cl_{14}$ nanoclusters was prepared. Specifically, 5 mg/ml PVK solution in chloroform and 4 mg/ml nanocluster solution in a toluene and methanol mixture were separately prepared. The two solutions were mixed at a 2:1 ratio and the EL film was spun cast on top of the hole injection layer at 2000 rpm for 30 seconds. The EL film was baked onto the hole injection layer in a glove box at 110° C. for 30 minutes.

Figure 6:
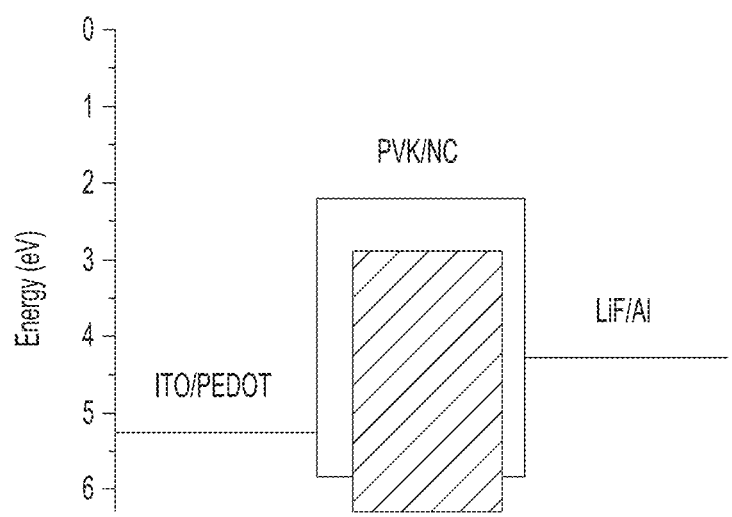
FIG. 6 is an energy level diagram for Device 1.

Next, the cathode was deposited on the EL film by thermally evaporating a 7.5 nm thick layer of LiF on the EL film and a 100 nm thick layer of Al on the LiF. The resulting architecture is referred to as "Device 1." FIG. 6 shows an energy level diagram for Device 1. A control device was made with the same architecture, but with neat PVK (without nanoclusters). Optical and electrical characterizations of the devices were then performed.

Figure 7:
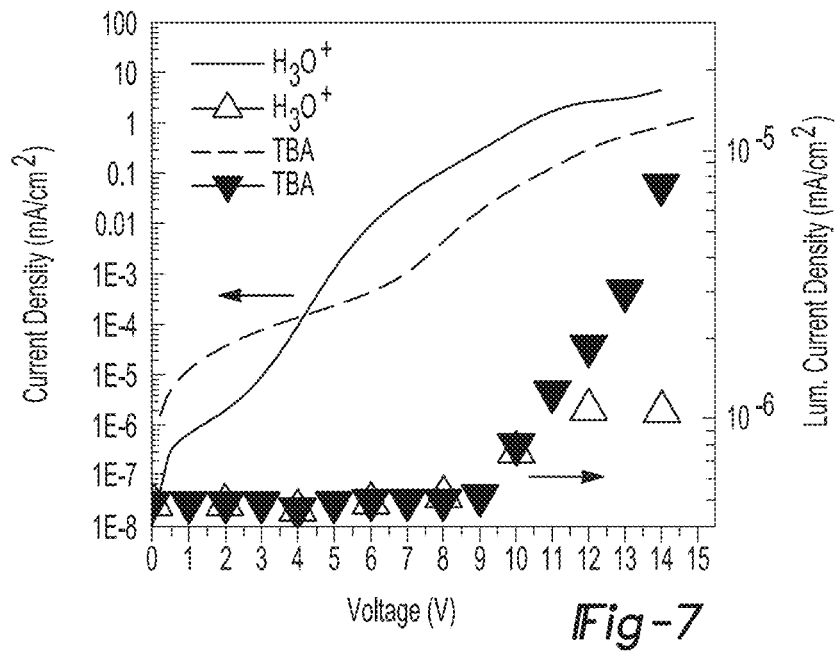
FIG. 7 is a log current versus voltage plot of Device 1 made with $(H_3O)_2Mo_6Cl_{14}$ or $TBA_2Mo_6Cl_{14}$ nanoclusters.
Figure 8:
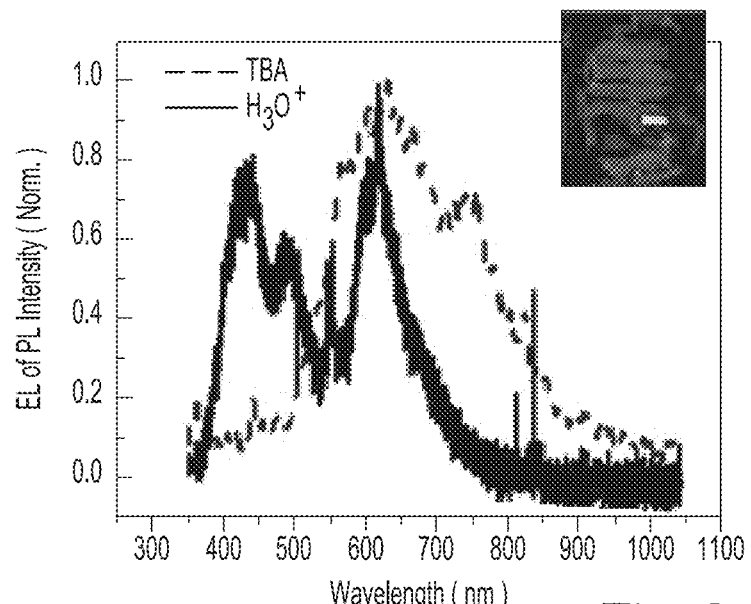
FIG. 8 is a graph comparison of EL spectra of Device 1 with $(H_3O)_2Mo_6Cl_{14}$ or $TBA_2Mo_6Cl_{14}$ nanoclusters; wherein the inset shows the device image captured at 12.0 V.

FIG. 7 shows a log-current versus voltage plot of Device 1 made with $(H_3O)_2Mo_6Cl_{14}$ and $TBA_2Mo_6Cl_{14}$ nanoclusters. The devices were electrically turned on at 3.0 V and 6.0 V for $(H_3O)_2Mo_6Cl_{14}$ and $TBA_2Mo_6Cl_{14}$ nanoclusters respectively. FIG. 8 shows electroluminescence (EL) spectrum of Device 1 made with $(H_3O)_2Mo_6Cl_{14}$ and $TBA_2Mo_6Cl_{14}$ clusters, wherein the inset shows the device image captured at 12.0 V with a white-pink color appearance (inset of FIG. 8). It is evident that EL spectrum for $(H_3O)_2$ $Mo_6Cl_{14}$ and $TBA_2Mo_6Cl_{14}$ obtained from this device architectures is distinct from the NIR spectra of nanoclusters obtained from the PL measurement providing opportunities for varied color emission.

Manufacturing and Characterizing Device 2

Patterned ITO glass was cleaned by degreasing in various solvents followed by UV-ozone treatment. A 40 nm thick layer of PEDOT/PSS was spun cast at 3000 rpm for 30 seconds onto the ITO glass as a hole injection layer. The PEDOT/PSS was then annealed to the ITO glass by incubating at 250° C. for 30 minutes.

A 13 nm to 20 nm thick emission layer (EL) comprising PVK and $TBA_2Mo_6Cl_{14}$ or $(H_3O)_2Mo_6Cl_{14}$ nanoclusters was prepared. Specifically, 5 mg/ml PVK solution in chloroform and a 4 mg/ml nanocluster solution in a toluene and methanol mixture were separately prepared. The two solutions were mixed at a 2:1 ratio and the EL film was spun cast on top of the hole injection layer at 2000 rpm for 30 seconds. The EL film was baked onto the hole injection layer in a glove box at 110° C. for 30 minutes.

Figure 9:
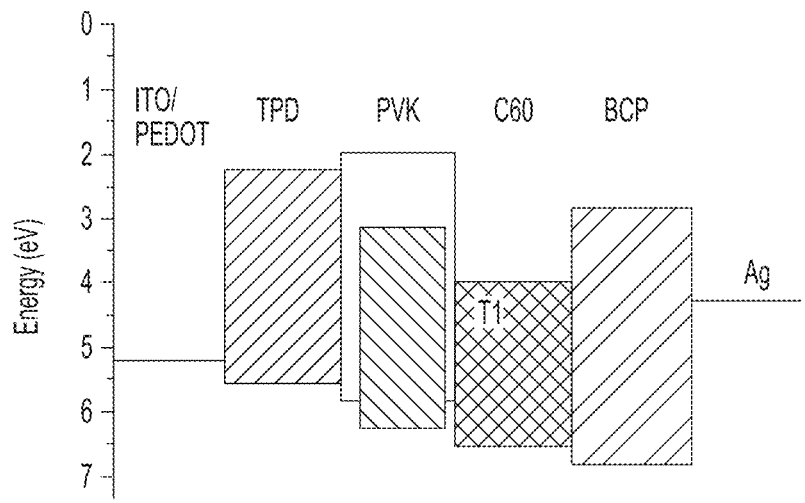
FIG. 9 is an energy level diagram for Device 2.

Next, a 30 nm thick electron transport layer consisting of 30 nm of $C_{60}$ and 10 nm of BCP or $MoO_3$ buffer layer were thermally evaporated on the emission layer at $3\times10^{-6}$ Torr. A cathode was deposited on the EL film by thermally evaporating a 100 nm thick layer of Ag on the electron transport layer. The resulting architecture is referred to as "Device 2." FIG. 9 shows an energy level diagram for Device 2. A control device was made with the same architecture, but with neat PVK (without nanoclusters). The control device is hereinafter referred to as Control 2. Optical and electrical characterizations of the devices were then performed. Control 2 did not show any EL.

Figure 10:
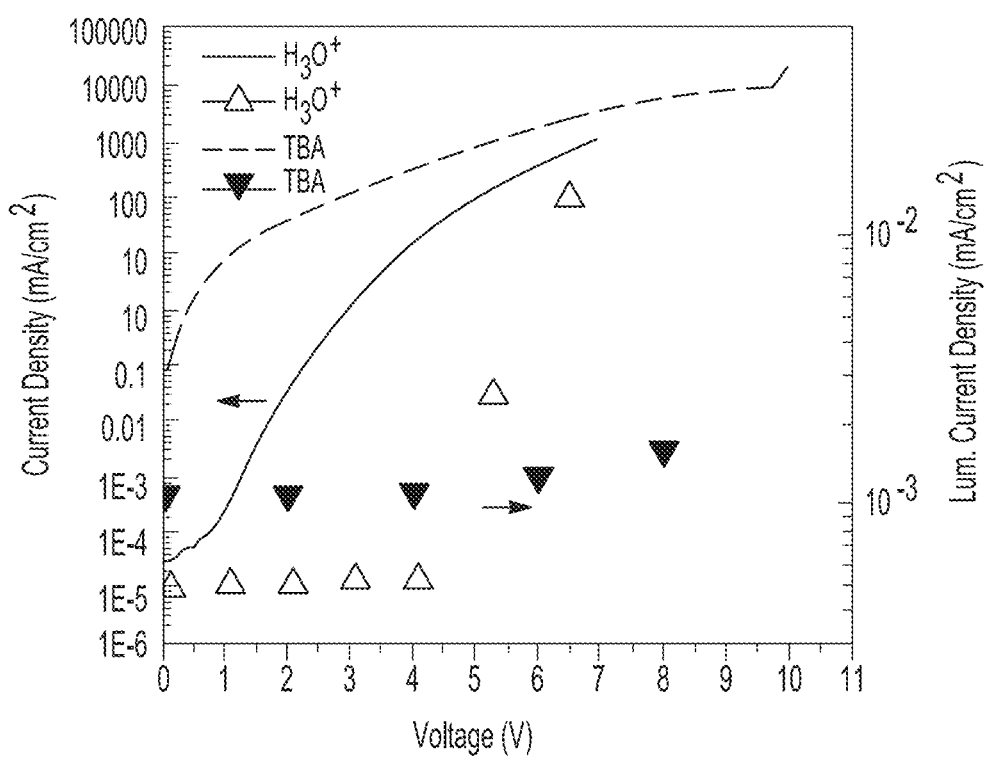
FIG. 10 is a log current versus voltage plot of Device 2 made with $(H_3O)_2Mo_6Cl_{14}$ or $TBA_2Mo_6Cl_{14}$ nanoclusters.
Figure 11:
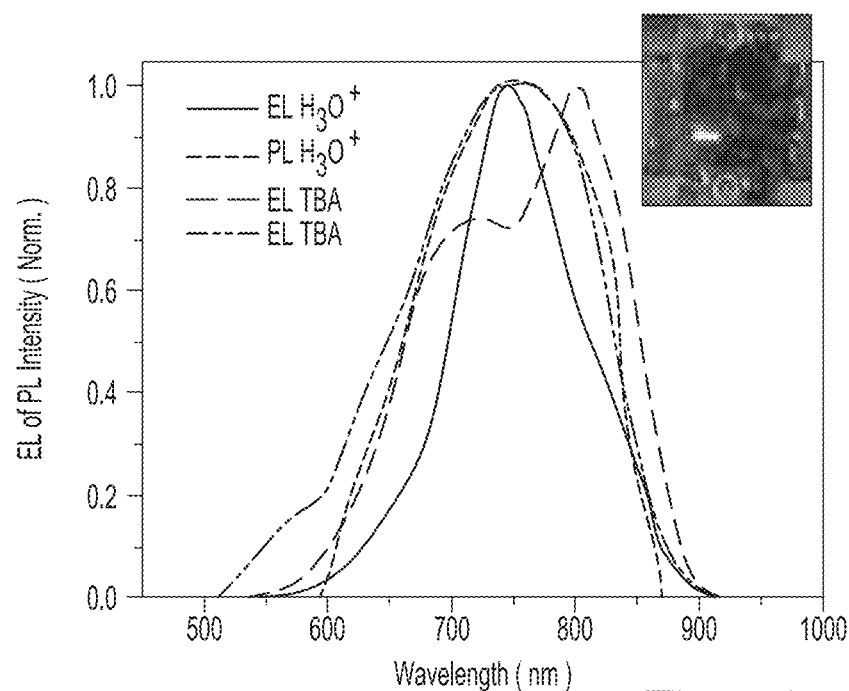
FIG. 11 is a comparison of PL and EL spectra of Device 2, made with $(H_3O)_2Mo_6Cl_{14}$ or $TBA_2Mo_6Cl_{14}$ nanoclusters; wherein the inset shows the device image captured at 6.0 V

FIG. 10 shows a log current versus voltage plot of Device 2 made with $(H_3O)_2Mo_6Cl_{14}$ and $TBA_2Mo_6Cl_{14}$ nanoclusters. Both devices were electrically turned on at 1.0 V. FIG. 11 is a comparison of PL and EL spectra of Device 2, wherein the inset shows the device image captured at 6.0 V. There is overlap between the nanocluster EL and its PL.

Manufacturing and Characterizing Device 3

An optically pumped device was manufactured by obtaining a UV-LED. A 1 mg/mL $TBA_2Mo_6Cl_{14}$ nanocluster solution was made by combining $TBA_2Mo_6Cl_{14}$ with acetonitrile. 30 mg/ml Poly(butyl methacrylate-co-methyl methacrylate) (PBMMA) was also prepared in acetonitrile. Equal volumes of the $TBA_2Mo_6Cl_{14}$ nanocluster solution and PBMMA, was then prepared, where PBMMA was a host material to generate a 1:1 $TBA_2Mo_6Cl_{14}$:PMMA mixture. The UV-LED was dipped in the 1:1 $TBA_2Mo_6Cl_{14}$:PMMA mixture and allowed to dry for about 20 minutes. The dipping/drying procedure was repeated 7 times to generate a device with 8 layers of $TBA_2Mo_6Cl_{14}$:PMMA. The resulting architecture is referred to as "Device 3."

Figure 12:
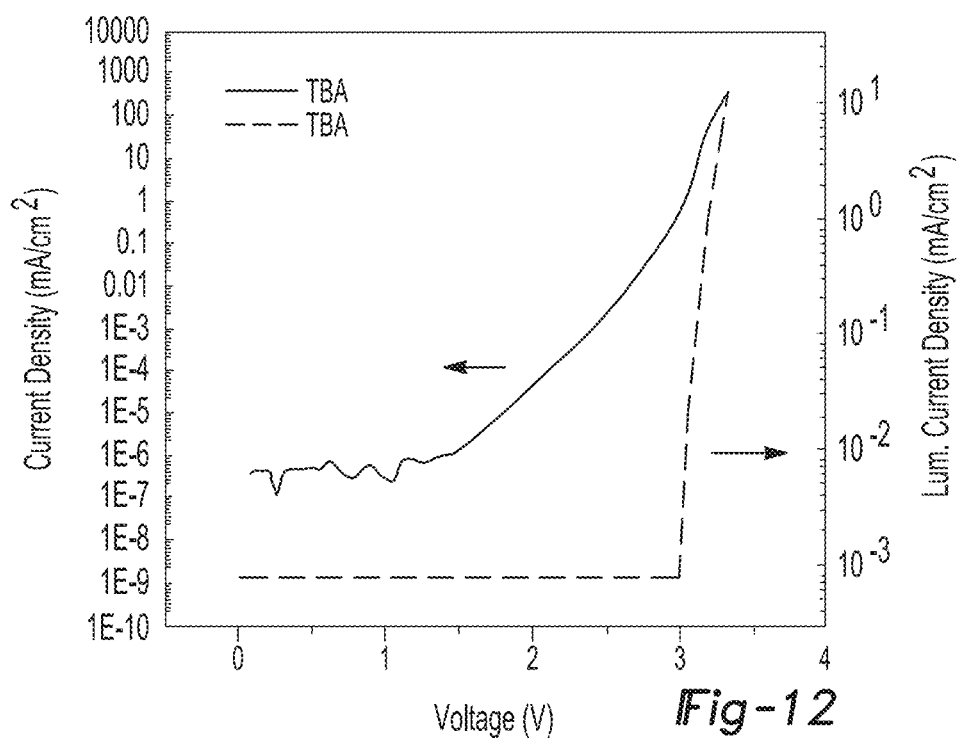
FIG. 12 is a log current versus voltage plot of Device 3.
Figure 13:
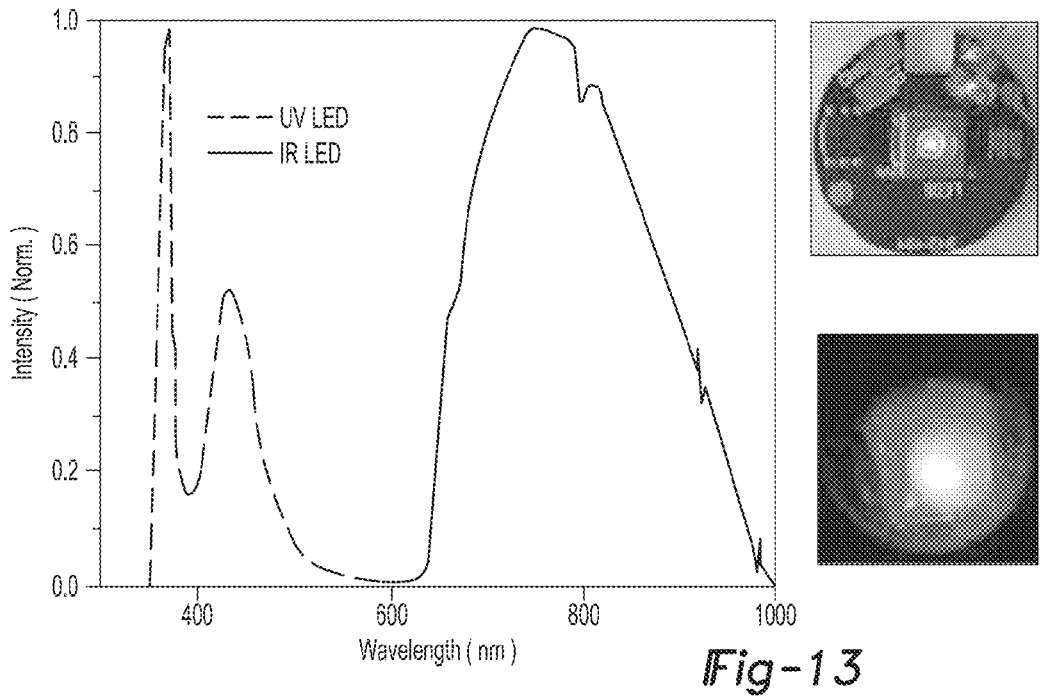
FIG. 13 is a graph showing EL characteristics of Device 3 along with device images.

FIG. 12 shows a log-current versus voltage plot of Device 3. Device 3 was electrically turned on at about 3.0 V. Device 3, was optically turned on at about 3.1 V to about 3.5 V. FIG. 13 shows the comparison of EL spectrum for Device 3. The spectrum shows emission from the UV-LED at about 357 nm and nanocluster emission in the NIR region.

Figure 14:
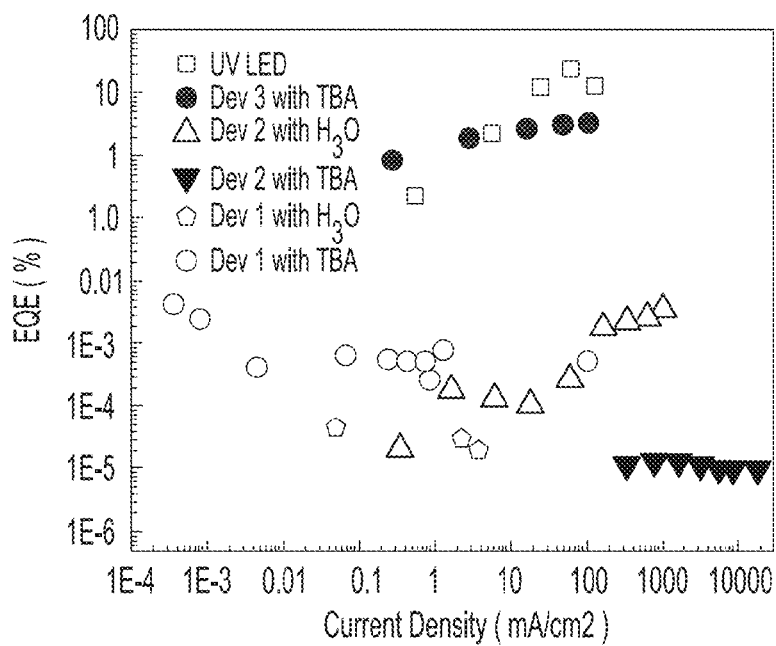
FIG. 14 is a graph showing external quantum efficiencies of Device 1 and Device 2 made with $(H_3O)_2Mo_6Cl_{14}$ or $TBA_2Mo_6Cl_{14}$ nanoclusters and Device 3 made with $TBA_2Mo_6Cl_{14}$ nanoclusters in comparison with the UV LED.

FIG. 14 shows the comparison of external quantum efficiency of Devices 1 and 2 made with $(H_3O)_2Mo_6Cl_{14}$ and $TBA_2Mo_6Cl_{14}$ nanoclusters and Device 3.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A luminescent device, comprising an emission layer comprising luminescent nanoclusters, wherein the layer comprising luminescent nanoclusters comprises nanoclusters selected from the group consisting of hexanuclear nanoclusters, octahedral nanoclusters, Chevral nanoclusters, edge-capped halide nanoclusters, metal nanoclusters, Chalcogenide nanoclusters, and combinations thereof and wherein the luminescent nanoclusters comprise a phosphorescent metal halide nanocluster or a phosphorescent metal halide nanocluster salt.

2. The device according to claim 1, wherein the metal halide nanocluster or the metal halide nanocluster salt is selected from the group consisting of $M_6X_{12}$, $M_6X_1 \cdot nR$, $A_2M_6X_{14}$, $A_2M_6X_1 \cdot nR$, $EM_6X_{14}$, $EM_6X_1 \cdot nR$, $M_6X_8L_6$, $A_2M_6X_8L_6$, $M_6X_{14}$, $M_6X_1 \cdot nR$, $A_4M_6X_{18}$, $A_4M_6X_1 \cdot nR$ and combinations thereof, wherein M represents metals, X represents halogens, A and E represents terminal 1+ and 2+ cations respectively, R represents a first ligand, L represents a second ligand, and n is value between zero and M+X.

3. The device according to claim 2, wherein M is Mo, W, Cr, Mn, Tc, Re, Cu, Ti, V, Ta, Nb, Sn, Zn, Zr, or Ga; X is F, Cl, Br, I, At, or a mixture thereof; and A is $H^+$, $H_3O^+$, $K^+$, $Na^+$, $Li^+$, $Rb^+$, $Cu^+$, $Cs^+$, ammonium, butylammonium, tetrabutylammonium (TBA), or $NR'_4^+$ where R' is an alkyl or aryl group, or a derivative thereof; L is F, Cl, Br, I, At, S or a mixture thereof, E is $Be^{2+}$, $Mg^{2+}$, $Ca^{2+}$, $Sr^{2+}$, $Cu^{2+}$, $Ni^{2+}$, $Ti^{2+}$, $Ba^{2+}$ or a mixture thereof; and R is $H_2O$, $CH_3CN$, or any other solvate.

4. The device according to claim 3, wherein the metal halide is $TBA_2Mo_6Cl_{14}$, $K_2 Mo_6Cl_{14}$ or $(H_3O)_2 Mo_6Cl_{14}$.

5. The device according to claim 1, wherein the device emits visibly colored, white, infrared (IR), or near-infrared (NIR) light.

6. The device according to claim 1, further comprising at least one dopant to provide improved color rendering for white light emission.

7. The device according to claim 6, wherein the at least one dopant is mixed with the luminescent phosphorescent nanoclusters.

8. The device according to claim 6, wherein the at least one dopant is present in a separate LED device that is positioned above or below a luminescent device.

9. The device according to claim 6, wherein the at least one dopant is a luminescent nanocluster, an organic dopant, or a combination thereof.

10. The device according to claim 9, wherein the organic dopant is Tris[2-phenylpyridinato-$C^2$,N]iridium(III) (Ir(ppy) 3), iridium(III) bis(4',6'-difluoro-phenyl-pyridinato) tetrakis (1-pyrazolyl) borate (FIr6), platinum octaethylporphyrin (PtOEP), or RD-15.

11. The device according to claim 1, wherein the luminescent phosphorescent nanoclusters are embedded in a host material.

12. The device according to claim 11, wherein the host material comprises poly(N-vinylcarbazole) (PVK), 1,4,5,8-Naphthalene-tetracarboxylic-dianhydride (NTCDA), 4,4'-Bis(N-carbazolyl)-1,1'-biphenyl (CBP), Poly[2-methoxy-5-(3',7'-dimethyloctyloxy)-1,4-phenylenevinylene] (MDMO), Poly(methyl methacrylate) (PMMA), Poly(ethyl methacrylate) (PEMA), Poly(butyl methacrylate-co-methyl methacrylate), [6,6]-phenyl-C61-butyric acid methyl ester, (PCBM), N,N'-Bis(3-methylphenyl)-N,N'-diphenylbenzidine (TPD), poly[2-methoxy-5-(2-ethylhexyloxy)-1,4-phenylenevinylene] (MEH-PPV), or poly(p-phenylene vinylene) (PPV), or a glass.

13. The device according to claim 1, wherein the device further comprises an anode and a cathode, wherein the anode and the cathode apply a current through the emission layer.

14. The device according to claim 13, wherein the anode and the cathode independently comprise LiF/Al, Au, or Ag, a transparent conducting oxide, a transparent conducting graphene thin film, a transparent conducting nanotube film, a transparent ultrathin metal, a metal, or metal nanowires.

15. The device according to claim 14, wherein the transparent conducting oxide is indium tin oxide (ITO), aluminum doped zinc oxide (AZO), zinc oxide, or gallium zinc oxide (GZO); the transparent ultrathin metal is Al, Au, Ag, Mo, or Ni; the metal is Al, Au, Ag, Ni, Cu, or Mo; and the metal nanowire is Al, Au, or Ag.

16. The device according to claim 1, wherein the device further comprises a conductive layer disposed adjacent to the emission layer, wherein the conductive layer promotes the injection of holes.

17. The device according to claim 16, wherein the conductive layer comprises poly(3,4-ethylenedioxythiophene):poly-(styrene sulfonate) (PEDOT/PSS).

18. The device according to claim 1, wherein the luminescent nanoclusters comprise phosphorescent nanoclusters and the device further comprises conductive transport layers, an anode, and a cathode, wherein the emission layer and the conductive transport layers are disposed between the anode and the cathode, and wherein the device emits white light or infrared light.

19. The device according to claim 1, wherein the device further comprises an electron transport layer disposed adjacent to the emission layer.

20. The device according to claim 19, wherein electron transport layer comprises $C_{60}$, tris(8-hydroxyquinolinato) aluminium, bathocuproine (BCP), bathophenanthroline (BPhen), bis-(2-methyl-8-chinolinolato)-(4-phenylphenolato)-aluminium(III) (BAlq2), or phenyl-C61-butyric acid methyl ester (PCBM).

21. The device according to claim 19, wherein the electron transport layer further comprises a buffer layer.

22. The device according to claim 21, wherein the buffer layer comprises $MoO_3$.

23. The device according to claim 22, wherein the electron transport layer comprises a fullerene, a metal oxide, $C_{60}$, bathocuproine (BCP), $MoO_3$, or combinations thereof.

24. The device according to claim 23, wherein the device emits NIR light.

25. The device according to claim 1, wherein the emission layer is disposed adjacent to a UV-emitting LED, wherein the UV light activates the emission layer to emit NIR light.

26. A luminescent device comprising an ITO anode, an emission layer comprising luminescent phosphorescent $TBA_2Mo_6Cl_{14}$, $K_2Mo_6Cl_{14}$, $(H_3O)_2Mo_6Cl_{14}$, or a combination thereof embedded in a host material, and a cathode.

27. The device according to claim 26, wherein the device further comprises an electron transport layer.

28. The device according to claim 27, wherein the electron transport layer comprises a fullerene, a metal oxide, $C_{60}$, bathocuproine (BCP), $MoO_3$, or combinations thereof.

29. The device according to claim 28, wherein the electron transport layer has a thickness of from about 1 nm to about 100 nm.

30. The device according to claim 29, wherein the device emits infrared (IR) or near infrared (NIR) light.

31. The device according to claim 26, wherein the host material comprises polymers, poly(N-vinylcarbazole) (PVK), 1,4,5,8-Naphthalene-tetracarboxylic-dianhydride (NTCDA), 4,4'-Bis(N-carbazolyl)-1,1'-biphenyl (CBP), Poly [2-methoxy-5-(3',7'-dimethyloctyloxy)-1,4-phenylenevinylene] (MDMO), Poly(methyl methacrylate) (PMMA), Poly(ethyl methacrylate) (PEMA), Poly(butyl methacrylate-co-methyl methacrylate), [6,6]-phenyl-C61-butyric acid methyl ester, (PCBM), N,N'-Bis(3-methylphenyl)-N,N'-diphenylbenzidine (TPD), poly[2-methoxy-5-(2-ethylhexyloxy)-1,4-phenylenevinylene] (MEH-PPV), poly(p-phenylene vinylene) (PPV), oxides, metal oxides, fullerenes, $C_{60}$, a glass or combinations thereof.

32. The device according to claim 26, wherein the cathode comprises LiF/Al, Au, Ag, Al, Mo, Ni, Cu, indium tin oxide (ITO), aluminum doped zinc oxide (AZO), zinc oxide, or gallium zinc oxide (GZO).

33. A luminescent device, comprising:
a. an anode and a cathode;
b. an emission layer comprising luminescent phosphorescent nanoclusters; and
c. an electron transport layer,
wherein the emission layer and the electron transport layer are disposed between the anode and the cathode, and wherein the device emits near infrared (NIR) light wherein the luminescent phosphorescent nanoclusters are selected from the group consisting of $M_6X_{12}$, $M_6X_{12}$.nR, $A_2M_6X_{14}$, $A_2M_6X_{14}$.nR, $EM_6X_{14}$, $EM_6X_{14}$.nR, $M_6X_8L_6$, $A_2M_6X_8L_6$, $M_6X_{14}$, $MeX_{14}$.nR, $A_4MeX_{18}$, $A_4MeX_{18}$.nR and combinations thereof, wherein M represents metals, X represents halogens, A and E represents terminal 1+ and 2+ cations respectively, R represents a first ligand, L represents a second ligand, and n is value between zero and M+X.

34. The device according to claim 33, wherein the luminescent phosphorescent nanoclusters are embedded in a host material, the host material being either PVK or PCBM, and wherein the luminescent phosphorescent nanoclusters comprise a metal halide.

35. The device according to claim 33, wherein M is Mo, W, Cr, Mn, Tc, Re, Cu, Ti, V, Ta, Nb, Sn, Zn, Zr, or Ga; X is F, Cl, Br, I, At, or a mixture thereof; and A is $H^+$, $H_3O^+$, $K^+$, $Na^+$, $Li^+$, $Rb^+$, $Cs^+$, ammonium, butylammonium, tetrabutylammonium (TBA), or $NR'_4{}^+$ where R' is independently selected from alkyl or aryl groups, wherein R' is optionally substituted with one or more of halo, nitro, cyano, hydroxy, hydroxyalkyl, haloalkyl, haloalkoxy, amino, azido, carboxy, carbamoyl, mercapto, sulphamoyl, $C_{1-10}$ alkyl, $C_{2-10}$ alkenyl, $C_{2-10}$ alkynyl, $C_{1-10}$ alkoxy, $C_{1-10}$ alkoxyalkyl, $C_{1-10}$ alkanoyl, $C_{1-10}$ alkanoyloxy, N—($C_{1-10}$ alkyl)amino, N,N—($C_{1-10}$ alkyl)$_2$amino, $C_{1-10}$ alkanoylamino, N—($C_{1-10}$ alkyl)carbamoyl, N,N—($C_{1-10}$ alkyl)$_2$carbamoyl, $C_{1-10}$ alkyl-S(O)$_a$ wherein a is 0, 1 or 2, $C_{1-10}$ alkoxycarbonyl, N—($C_{1-10}$ alkyl) sulphamoyl, N,N—($C_{1-10}$ alkyl)$_2$sulphamoyl, $H_2NS(O)_2$NH—, N—($C_{1-10}$ alkyl)NHS(O)$_2$NH—, N,N—($C_{1-10}$ alkyl)$_2$NS(O)$_2$NH—, aryl, aryloxy, arylthio, heteroaryl, heteroaryloxy, cycloalkyl, cycloalkyloxy, heterocyclyl, heterocyclyl (C=O)—, heterocyclyloxy and heterocyclylthio, wherein these selections are non-limiting; L is F, Cl, Br, I, At, S or a mixture thereof, E is $Be^{2+}$, $Mg^{2+}$, $Ca^{2+}$, $Sr^{2+}$, $Ba^{2+}$ or a mixture thereof; and R is $H_2O$, $CH_3CN$, or any other solvate.

36. The device according to claim 35, wherein the luminescent phosphorescent nanoclusters comprise $TBA_2Mo_6Cl_{14}$, $K_2 Mo_6Cl_{14}$ or $(H_3O)_2 Mo_6Cl_{14}$.

37. The device according to claim 33, wherein the device further comprises a conductive layer disposed adjacent to the emission layer, wherein the conductive layer promotes the injection of holes.

38. The device according to claim 37, wherein the conductive layer comprises poly(3,4-ethylenedioxythiophene):poly(styrene sulfonate) (PEDOT/PSS).

* * * * *